(12) United States Patent
Wallace et al.

(10) Patent No.: US 10,430,363 B2
(45) Date of Patent: Oct. 1, 2019

(54) SYSTEMS AND METHODS OF IN-SITU DIGITAL EYE CHARACTERIZATION FOR SERIAL DATA TRANSMITTER CIRCUITRY

(71) Applicants: Doug Wallace, Round Rock, TX (US); Bhyrav Mutnury, Round Rock, TX (US); Vijendera Kumar, Rajasthan (IN)

(72) Inventors: Doug Wallace, Round Rock, TX (US); Bhyrav Mutnury, Round Rock, TX (US); Vijendera Kumar, Rajasthan (IN)

(73) Assignee: Dell Products L.P., Round Rock, TX (US)

( * ) Notice: Subject to any disclaimer, the term of this patent is extended or adjusted under 35 U.S.C. 154(b) by 169 days.

(21) Appl. No.: 14/944,775

(22) Filed: Nov. 18, 2015

(65) Prior Publication Data

US 2017/0139866 A1    May 18, 2017

(51) Int. Cl.
*G06F 13/40* (2006.01)
*G06F 13/42* (2006.01)

(52) U.S. Cl.
CPC ...... *G06F 13/4027* (2013.01); *G06F 13/4221* (2013.01); *G06F 13/4282* (2013.01)

(58) Field of Classification Search
CPC ............. G06F 13/4027; G06F 13/4221; G06F 13/4282
See application file for complete search history.

(56) References Cited

U.S. PATENT DOCUMENTS

| | | | | |
|---|---|---|---|---|
| 6,885,209 B2 * | 4/2005 | Mak | ........................ | G01R 29/26 324/750.3 |
| 7,363,563 B1 * | 4/2008 | Hissen | ..................... | H04L 1/243 327/144 |
| 8,553,469 B2 | 10/2013 | Berke | | |
| 8,638,838 B1 * | 1/2014 | Betts | ......................... | H04L 5/16 326/30 |

(Continued)

OTHER PUBLICATIONS

ReDriver, Pericom.com, Printed From Internet Sep. 25, 2015, 4 pgs.

(Continued)

*Primary Examiner* — Tim T Vo
*Assistant Examiner* — Harry Z Wang
(74) *Attorney, Agent, or Firm* — Egan Peterman Enders Huston

(57) ABSTRACT

Systems and methods are provided that may be implemented in-situ and on-chip to capture a digital signal eye of a serial transmit signal produced by a transmitter circuit of integrated SerDes PHY transceiver circuitry. In one example, a serial transmit signal produced by a transmitter side circuit of an integrated SerDes PHY transceiver circuit may be looped back on chip to the receiver side circuit of the same SerDes PHY transceiver circuit such that an integrated digital eye monitor circuit of the SerDes receiver circuit may capture the digital eye of the serial transmit signal of the same SerDes PHY circuit. In another example, a digital eye monitor circuit may be integrated on the transmitter side of an integrated SerDes PHY transceiver circuit such that a serial transmit signal produced by the transmitter side circuit of may be captured on-chip.

21 Claims, 10 Drawing Sheets

(56) References Cited

U.S. PATENT DOCUMENTS

| | | | |
|---|---|---|---|
| 8,744,012 B1 * | 6/2014 | Ding | H04L 1/203 |
| | | | 375/316 |
| 8,949,679 B2 | 2/2015 | Berke | |
| 8,958,501 B2 | 2/2015 | Nazemi et al. | |
| 9,036,291 B1 | 5/2015 | Nava et al. | |
| 2002/0060820 A1 | 5/2002 | Buchali | |
| 2004/0076113 A1 * | 4/2004 | Aronson | H04B 10/40 |
| | | | 370/217 |
| 2007/0121711 A1 * | 5/2007 | Offord | G01R 31/31709 |
| | | | 375/219 |
| 2008/0079490 A1 * | 4/2008 | Nguyen | H03F 3/45085 |
| | | | 330/152 |
| 2009/0213913 A1 * | 8/2009 | Farmer | H04L 1/243 |
| | | | 375/219 |
| 2010/0312515 A1 * | 12/2010 | Miyasaka | G01R 31/2839 |
| | | | 702/106 |
| 2013/0073749 A1 * | 3/2013 | Tremblay | H04L 12/40032 |
| | | | 710/16 |
| 2014/0173367 A1 | 6/2014 | Lambert et al. | |

OTHER PUBLICATIONS

Katz, IBIS-ATM, SiSoft, Backchannel With Repeaters (retime or Redriver), Dec. 18, 2012, 8 pgs.
Eshghi et al., "SSD Architecture and PCI Express Interface", Chapter 2, Inside Solid State Drives, Springer Series in Advanced Microelectronics, 2013, 28 pgs.
Janukowics et al, "Managing Transition Form Parallel to Serial Storage Interfaces", News & Analysis, 2003, 6 pgs.
Embedded Computing Design, "Monitor Opens and Eye to High Speed Serdes Performance", 2009, 4 pgs.
Wikipedia, "SerDes", Printed From Internet Nov. 3, 2015, 3 pgs.

\* cited by examiner

SYSTEMS AND METHODS OF IN-SITU DIGITAL EYE CHARACTERIZATION FOR SERIAL DATA TRANSMITTER CIRCUITRY

FIELD OF THE INVENTION

This invention relates generally to serial data transmission and, more particularly, to digital eye characterization for serial data transmitter circuitry.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Storage devices for information handling systems include hard disk drives (HDDs) and solid state drives (SSDs). Current HDD and SSD storage devices typically utilize a serial-based external interface, such as serial ATA (SATA), to connect internal read and write circuitry of the storage device to an information handling system serial data bus. Such storage devices also typically include serializer/deserializer physical layer circuitry (SerDes PHY) to convert between an internal parallel data bus within the storage device and the external serial data bus of the storage device. During storage device development and manufacture, SerDes PHY circuitry is characterized to ensure compliance with electrical specifications. SerDes characterization is important, for example, in the case of enterprise server development process which depends on server manufacturer teams working together to ensure a server product is developed and delivered robustly and timely. Uncertainty is added to the server development process when server manufacturer teams work with different external silicon vendors who use different SerDes PHYs. Typically, a server manufacturer provides an electrical specification which external silicon vendors are supposed to meet. When a silicon part fails to meet the manufacturer's electrical requirements, it is usually not caught by internal manufacturer screening due to limited testing and resource constraints. A random screening process is very cumbersome and involves a lot of work as well. Moreover, there is also a lot of variation between measurement to measurement due to human error, variation in hardware equipment and software, and other variants that complicate screening to verify silicon compliance with electrical specifications.

Characterization of settings for SerDes PHY circuitry is a complex and labor-intensive task that involves designing and constructing proper test equipment such as load boards and test cards, as well as ensuring that proper silicon samples are collected for testing. Current common practice to characterize PHY today is to mount the SerDes PHY circuitry on a test board with connectors that go into a high bandwidth scope (HBWS). Challenges incurred with the approach include a huge effort in terms of time and manual work, sensitivity to torquing and mating, repeatability is dependent on hardware equipment and software, and wear and tear on hardware. Thus, actual testing of individual circuit components is a complex and time-consuming process. To measure and characterize SerDes PHY de-emphasis (or equalization), jitter and voltage swing in a laboratory for each and very storage device is not only time consuming but also inefficient as it is not practically possible to test and characterize all storage device drives in the available time due to permutations that include different storage device and silicon vendors, different drive part numbers, different firmware revisions etc.

FIG. 9 illustrates conventional integrated SerDes PHY circuitry 900 such as used in a storage device of an information handling system. As shown, SerDes PHY circuit 900 includes separate transmitter circuitry 912 and receiver circuitry 914 integrated on the same semiconductor integrated circuit chip that operate independently of each other to transmit and receive data, respectively, across a SATA serial data bus 950 of the information handling system that is external to the chip. The separate transmitter and receiver circuits 912 and 914 of conventional SerDes PHY circuit 900 do not exchange data with each other on chip and are not connected on chip to exchange data between each other. Rather, the separate SerDes transmitter circuitry 912 serializes parallel advanced technology attachment (ATA) data from the storage device and transmits the SATA serial data off chip to other separate components of the information handling system (e.g., such as to a platform controller hub "PCH") across an external transmit channel 913 of the serial data bus 950. The separate SerDes receiver circuitry 914 receives off chip serial SATA data from the other separate components of the information handling system across an external receive channel 915 of the serial data bus 950, and de-serializes the received serial data to produce ATA data for use by the storage device as shown.

In FIG. 9, an on-chip "digital eye" monitor 901 is integrated within the separate receiver circuitry 914 of the conventional SerDes PHY circuit 900, and is used to observe receive-side serial SATA data received from off chip by the SerDes receiver side circuitry 914 from separate information handling system components across the external receive channel 915 of the serial data bus 950. The on-chip digital eye 901 estimates the digital signal eye of the incoming received serial data signal after equalization by components of the receive side circuitry 914, and outputs the on-chip digital eye for display on an external display device so that performance of the SerDes receive side circuitry may be evaluated during testing. In this approach, the digital signal eye of the receive signal is estimated by shifting the phase rotators left and right until failure occurs, and also by shifting the voltage offset up and down.

SUMMARY OF THE INVENTION

Disclosed herein are systems and methods that may be implemented in-situ and on-chip to capture a digital signal eye of a serial transmit signal produced by a transmitter circuit of integrated SerDes PHY circuitry, such as may be included in a storage device of an information handling system or in any other data communication architecture. In one embodiment, a serial transmit signal produced by a transmitter side circuit of a SerDes PHY transceiver circuit that is integrated on a single semiconductor integrated circuit chip may be looped back on-chip to the receiver side circuit of the same SerDes PHY transceiver circuit (e.g., looped back into the receiver analog front end (AFE)) such that an integrated digital eye monitor circuit of the SerDes receiver circuit may capture the digital eye of the serial transmit signal of the same SerDes PHY transceiver circuit rather than being transmitted off-chip to a serial transmit channel of a digital communication bus or other external communication media that is coupled to the SerDes PHY circuit. The integrated digital eye monitor circuit of the receiver side monitor circuit may be further configured to output the on-chip captured digital eye of the serial transmit signal, e.g., for display on a display device such as LCD or LED monitor. Because it is captured in-situ, on-chip and at the signal latch point, the digital eye of the serial transmit signal may be more accurately and repeatably captured using the disclosed systems and methods than is possible with a transmit signal digital eye that is captured by off-chip circuitry, such as test bench equipment (e.g., external oscilloscope coupled across an external digital communication path) where signal loss and/or interference degrades the digital eye accuracy. Such off-chip digital eye capture is subject to external errors and reduction in repeatability induced by transmission line and other external circuitry.

In one exemplary embodiment, integrated SerDes PHY circuitry may be configured to implement a normal transceiver operation mode during which the receiver side circuit of the SerDes PHY receives and processes and deserializes off-chip received serial data signals. The same integrated SerDes PHY circuitry may also be configured to selectively implement a transmitter side digital eye test mode during which one or more signal conditioning features of the receiver side circuitry (e.g., such as amplification, equalization, filtering, etc.) may be disabled to allow the integrated digital eye monitor circuitry of the receiver side circuitry to accurately capture the transmitter side digital signal eye of an on-chip serial transmit signal from the transmitter side circuitry of the same SerDes PHY circuitry. In the test mode, the captured transmitter digital eye may also be output for test and display. In this way, using the disclosed systems and methods, SerDes PHY (including high speed SerDes (HSS)) circuit devices may be characterized dynamically and in-situ during manufacture and/or testing to make sure the devices (or particular device design) are meeting a manufacturer's or designer's electrical specification with regard to transmitter signal characteristics such as De-emphasis, V-swing and jitter of transmitter, e.g., to make it easier to identify SerDes PHY chips that do not meet electrical specifications and/or to assist in debugging of a chip circuit design. Other possible SerDes characterization tasks include determining worse case and best case signal loss characteristics for a given SerDes PHY transceiver circuit design. In another exemplary embodiment, a transmitter side digital eye may be captured in a similar manner from an installed and operational SerDes PHY device in the field (e.g., such as employed in an in-service storage device of a customer-operated information handling system) and output for display and analysis for trouble-shooting purposes to determine if the transmitter side of the SerDes PHY is operating properly and within specifications.

In one exemplary embodiment, an integral switch may be provided to selectively divert the serial transmit signal from the transmitter side circuit to the receive side circuit, e.g., so that using the switch enable, a chip designer or tester may choose if the transmitter side output signal is to be transmitted off-chip into an external channel or if it is to be looped back on-chip into the receiver side circuitry of the same SerDes PHY chip. Advantageously, the disclosed systems and methods may be implemented in one exemplary embodiment in a manner that is repeatable and which also results in minimal noise of the on-chip transmitter signal as the distortion is extremely small due to the short travel distances within the silicon of the SerDes PHY semiconductor integrated circuit (IC) chip. In one embodiment, some of the general purpose input output (GPIO) pins to the software control register of a SerDes PHY chip may be used for automatic reading of characteristics such as De-emphasis and V-swing setting of transmitter, etc.

In another exemplary embodiment, a digital eye monitor circuit may be integrated on the transmitter side of an integrated SerDes PHY transceiver circuit such that a serial transmit signal produced by the transmitter side circuit of may be captured on-chip and within the transmitter side circuitry by the transmitter side digital eye rather than being transmitted off chip to a serial transmit channel of a digital communication bus or other external communication media coupled to the SerDes PHY circuit. The integrated digital eye monitor circuit of the transmitter side circuit may be further configured to output the on-chip captured digital eye information of the serial transmit signal, e.g., for display on a display device such as LCD or LED monitor.

Advantages and capabilities that may be realized using embodiments of the disclosed systems and methods include, but are not limited to: accurate estimation of SerDes transmitter side settings with minimal signal distortion; testing and circuit characterization during SerDes PHY system operation in test mode without requiring special test cards, equipment and software for testing; real time capturing of data to help in fine tuning a particular SerDes circuit design for improved signal integrity ("SI") margins; Volume qualification of SerDes circuitry with least scope for error; characterizing and/or screening of re-drivers and re-timers; data processing through external software that may be enabled through GPIO pins; and characterization of equalization and/or jitter components of transmitter side circuitry of a SerDes PHY transceiver. Moreover, in one embodiment using the disclosed systems and methods, transmitter side signal characteristics may identified, characterized and/or corrected for using the in-situ and on-chip captured digital signal eye of a serial transmit signal. Such signal characteristics include cross talk, loss, reflection, jitter, impedance, transmission line loss, voltage swing, rise time, transmitter process/voltage/temperature (PVT) variation.

In one respect, disclosed herein is a method, including: receiving outgoing parallel data from an external parallel data communication path in a transmitter of serializer/deserializer physical layer (SerDes PHY) integrated transceiver circuitry; producing outgoing serial data from the outgoing parallel data in a serial data transmit path of the transmitter; providing the outgoing serial data from the transmitter to an external serial data communication path; and providing the outgoing serial data to an integrated digital eye monitor of the SerDes PHY integrated transceiver circuitry from the serial data transmit path of the transmitter.

In another respect, disclosed herein is serializer/deserializer physical layer (SerDes PHY) integrated transceiver circuitry configured to be coupled between an external serial data communication path and an external parallel data communication path. The integrated SerDes PHY transceiver circuitry may include: a receiver configured to receive incoming serial data from the external serial data communication path and to provide incoming parallel data to the external parallel data communication path, the receiver including a serial data receive path that includes a de-serializer coupled to produce the incoming parallel data from the receiver incoming serial data; a transmitter coupled to the integrated digital eye monitor and configured to be coupled to receive outgoing parallel data from the external parallel data communication path and to provide transmitter outgoing serial data to the external serial data communication path, the transmitter including a serial data transmit path that includes a serializer configured to produce the transmitter outgoing serial data; and an integrated digital eye monitor coupled to the serial data transmit path to receive the transmitter outgoing serial data from the serial data transmit path.

In another respect, disclosed herein is an information handling system, including: a serial data communication path coupled to a first serializer/deserializer physical layer (SerDes PHY) transceiver; a parallel data communication path coupled to a processing device configured to receive and transmit parallel data; and integrated circuitry configured as a second SerDes PHY transceiver that is coupled between the serial data communication path and the parallel data communication path, each of the serial data communication path and the parallel data communication path being external to the integrated SerDes PHY transceiver circuitry. The second SerDes PHY transceiver may include: a receiver coupled to receive incoming serial data from the external serial data communication path and to provide incoming parallel data to the processing device across the external parallel data communication path, the receiver including a serial data receive path that includes a de-serializer coupled to produce the incoming parallel data from the receiver incoming serial data, a transmitter coupled to the integrated digital eye monitor and coupled to receive outgoing parallel data from the processing device across the external parallel data communication path and to provide transmitter outgoing serial data to the first SerDes PHY transceiver across the external serial data communication path, the transmitter including a serial data transmit path that includes a serializer configured to produce the transmitter outgoing serial data, and an integrated digital eye monitor coupled to the serial data transmit path to receive the transmitter outgoing serial data from the serial data transmit path.

DESCRIPTION OF ILLUSTRATIVE EMBODIMENTS

Figure 1:
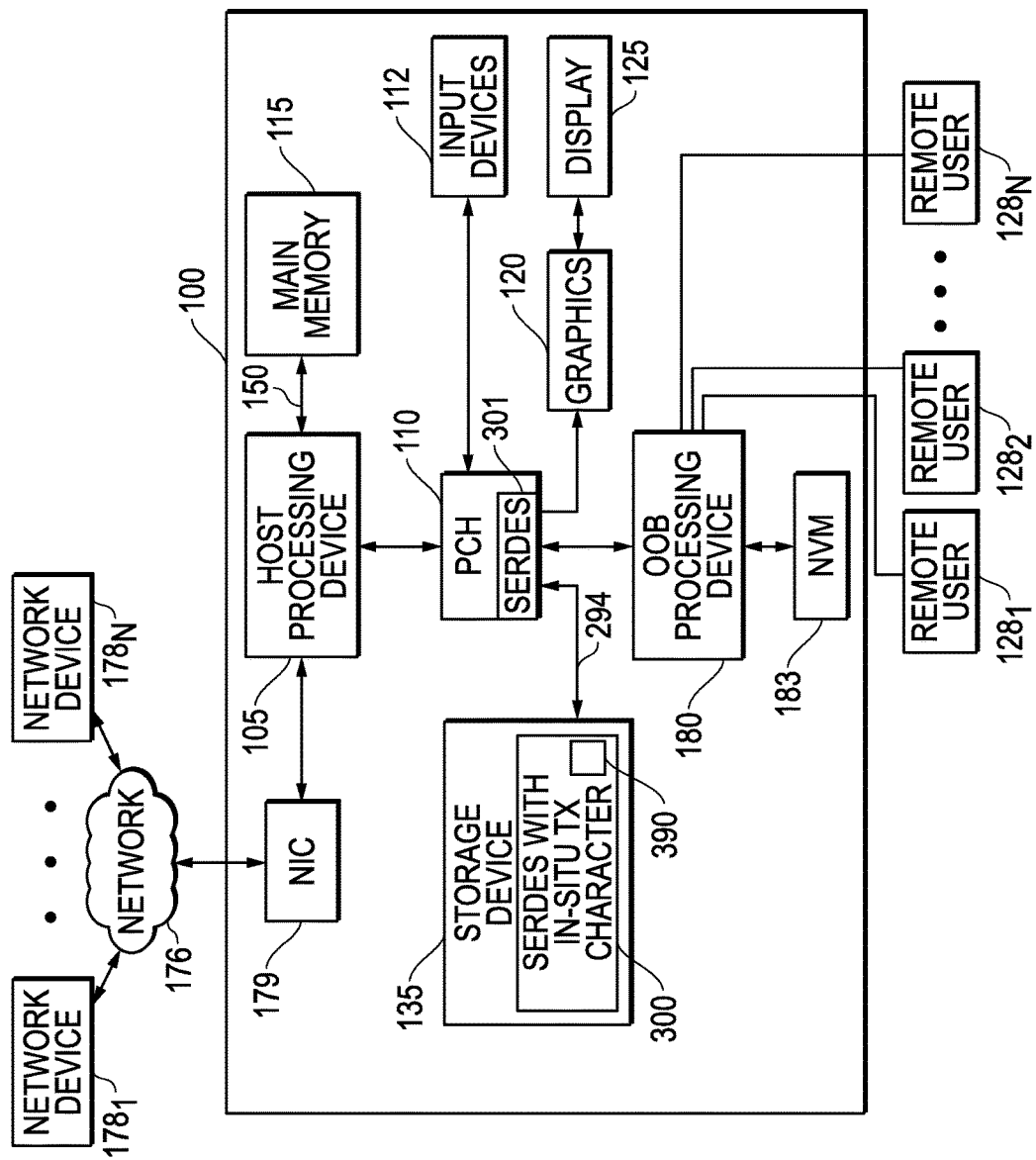
FIG. 1 illustrates an information handling system according to one exemplary embodiment of the disclosed systems and methods.

FIG. 1 illustrates one exemplary embodiment of an information handling system 100 configured as a server system that includes at least one host processing device 105 which may be a central processing unit (CPU) such as an Intel Pentium series processor, an Advanced Micro Devices (AMD) processor or other type of host processing device that executes an operating system (OS) for system 100. Host processing device 105 may be provided in one embodiment with an integrated memory controller (iMC) to facilitate memory functions, although it will be understood that a memory controller may be alternatively provided as a separate chip or other circuit in other embodiments. As shown in FIG. 1, main system memory 115 (e.g., DRAM) may be coupled via DDR channel 150 as shown to host processing device 105. An external display 125 (e.g., LCD or LED display, touchscreen, or other suitable display device) may be coupled to an optional discrete graphics processing unit (GPU) 120 to provide visual images (e.g., via displayed interactive graphical user interface) to the user. GPU 120 is in turn coupled to host processing device 105 via platform controller hub (PCH) 110 which facilitates input/output functions for the information handling system 100. It will be understood that functions of GPU 105 may alternatively or additionally be integrated within the host processing device 105 and/or that other types of graphics processing devices may be present, e.g., graphics-derivative processors such as physics/gaming processors.

Still referring to FIG. 1, local system storage 135 (e.g., hard disk drive (HDD), solid state drive (SSD), optical drive, etc.) may be coupled via serial data communication path 294 (e.g., serial data bus such as SATA) to PCH 110 and its controller chip to provide permanent storage for the information handling system 100. As illustrated, storage device 135 includes integrated SerDes PHY transceiver circuit 300 having integrated in-situ transmitter (TX) characterization circuitry as described further herein. PCH 110 may also include a SerDes PHY transceiver circuit 301 as shown, which in one embodiment may also be configured with the same type and function of integrated in-situ transmitter (TX) characterization circuitry described herein for SerDes PHY transceiver circuit 300. External input devices 112 (e.g., such as a keyboard, mouse, touchpad, touchscreen etc.) may be coupled as shown to PCH 110 and its controller chip to enable the user to interact with the information handling system 100 and programs or other software/firmware executing thereon. As further shown, a network interface card (NIC) 179 may be coupled to host processing device 105 to enable communication between information handling system 100 and various multiple network devices $178_1$-$178_n$ across network (e.g., Internet, corporate intranet, etc.) 176, which together may form a networking system that allows system 100 to store data and/or perform processing tasks for network devices 178.

In the illustrated embodiment, an optional out-of-band processing device 180 (e.g., baseboard management controller (BMC), service processor, embedded processor, embedded controller (EC), remote access controller such as integrated Dell Remote Access Controller (iDRAC) available from Dell Products L.P. of Round Rock, Tex., etc.) may be coupled to PCH 110 and provided with persistent storage/non-volatile memory 183, although an out-of-band processing device with integrated persistent storage may also be employed. As shown in the exemplary embodiment of FIG. 1, out-of-band processing device 180 is a separate and independent processing device from any in-band host central processing unit (CPU) such as host processing device 105 that runs the host OS of system 100, e.g., such as a RAID system server or other type of server. In this regard, out-of-band processing device 180 may operate without management of any application executing with a host OS on the host CPU. Also shown in FIG. 1 are remote user/s $128_1$ to $128_N$ that in one embodiment may be optionally provided remote access to configure and/or access and view aspects of system 100 from a remote location through out-of-band processing device 180 configured as remote access controller.

Although FIG. 1 illustrates an information handling system 100 configured as a server, it will be understood that the disclosed systems and methods may be implemented with other types of information handling system configurations (e.g., desktop or tower computer systems, notebook computer systems, etc.) having one or more storage devices 135 that include an integrated SerDes PHY transceiver circuit 300 having integrated in-situ transmitter (TX) characterization circuit 390 described further herein. It will also be understood that the disclosed systems and methods may be implemented in non-storage device applications, including in any serial data communication application (e.g., PHY or input/output I/O) and/or architecture including serial data transceiver circuitry to transmit and receive serial data across any type of high speed serial ink (e.g., SATA, Fibre Channel, Gigabit Ethernet, XAUI, RXAUI, SAS, SATA, USB 3.0, PCI Express, etc.). Examples of such other types of serial data transceiver applications include, but are not limited to, repeaters, re-drivers, ASICs, processor or controller semiconductor chips, etc. In this regard, the disclosed systems and methods may be implemented or integrated as a core in another device (e.g., such as ASIC), or may be implemented as a stand-alone semiconductor integrated circuit chip.

Figure 2A:
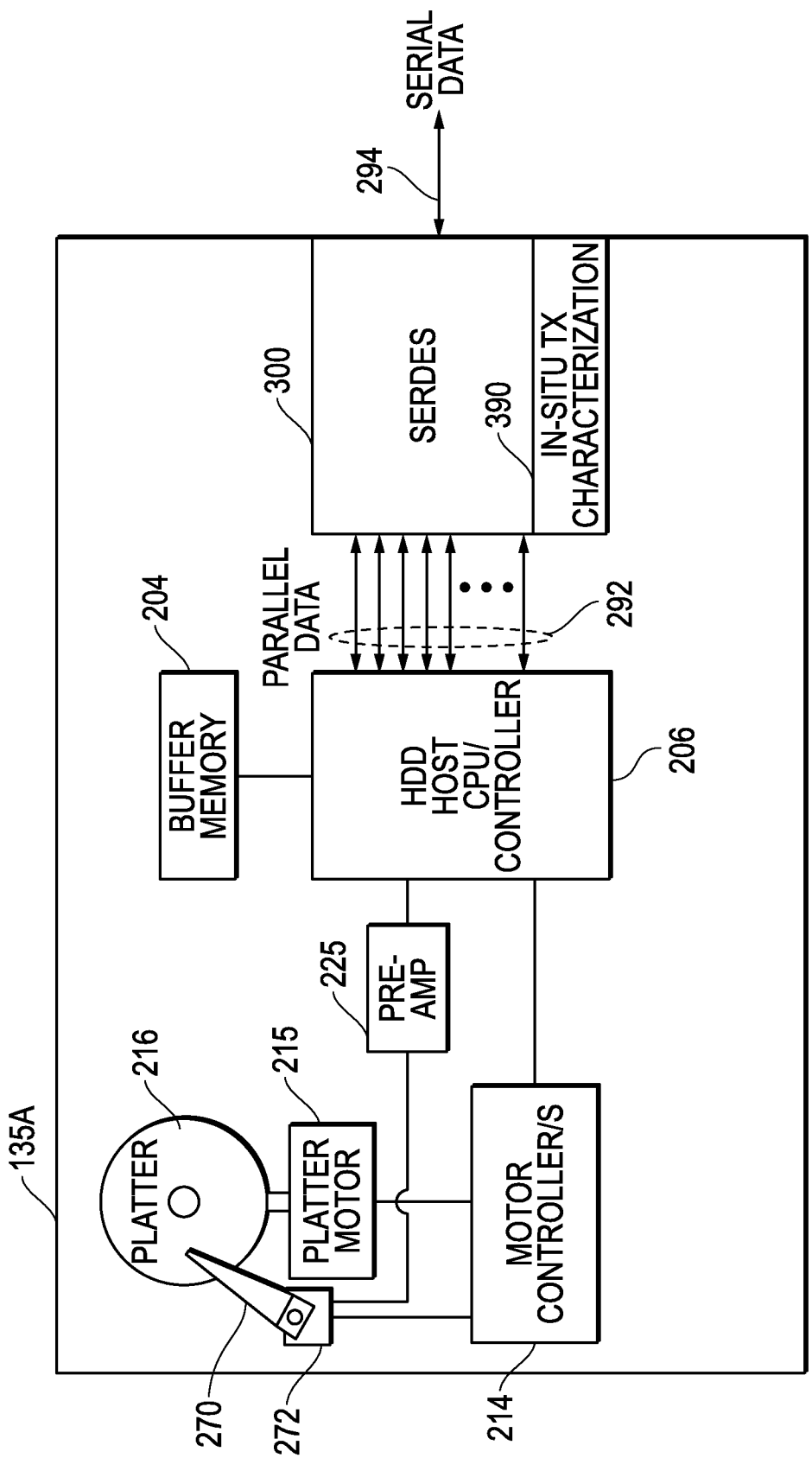
FIG. 2A illustrates a storage device according to one exemplary embodiment of the disclosed systems and methods.

FIG. 2A illustrates one exemplary embodiment of a storage device 135 configured in the form of a HDD 135A that includes one or more processing devices configured to operate as a host CPU/controller 206 that together with motor controller/s 214 controls operation of platter motor 215 to rotate magnetic or optical drive platter 216 and controls a voice coil motor 272 to position swing arm and drive heads 270 relative to the rotating platter 216 to read data from (and write data to) substantially concentric data tracks defined on the platter according to default servo system coordinates. Also provided are optional buffer 204 (e.g., static random-access memory SRAM) coupled to host CPU/controller 206, and preamp 225. As shown, integrated SerDes PHY transceiver circuit 300 (e.g., provided as an integrated circuit chip) is present and includes in-situ transmitter (TX) characterization circuitry 390.

In the illustrated embodiment of FIG. 2A, integrated SerDes PHY transceiver circuit 300 is configured, among other things, to receive incoming serial data from another external component (e.g., such as PCH 110) across serial data communication path 294 and to provide this data as incoming parallel data across parallel data communication path 292 (e.g., ATA data path, side bands, etc.) to host CPU/controller 206 (e.g., for writing to platter 216). SerDes PHY transceiver circuit 300 is also configured to receive outgoing parallel data (e.g., read from platter 216) from host CPU/controller 206 across parallel data communication path 292, and to provide this data as outgoing serial data to another external component (e.g., such as PCH 110) across serial data communication path 294. Further information on example HDD configurations may be found in U.S. Pat. No. 9,036,291, which is incorporated herein by reference in its entirety.

Figure 2B:
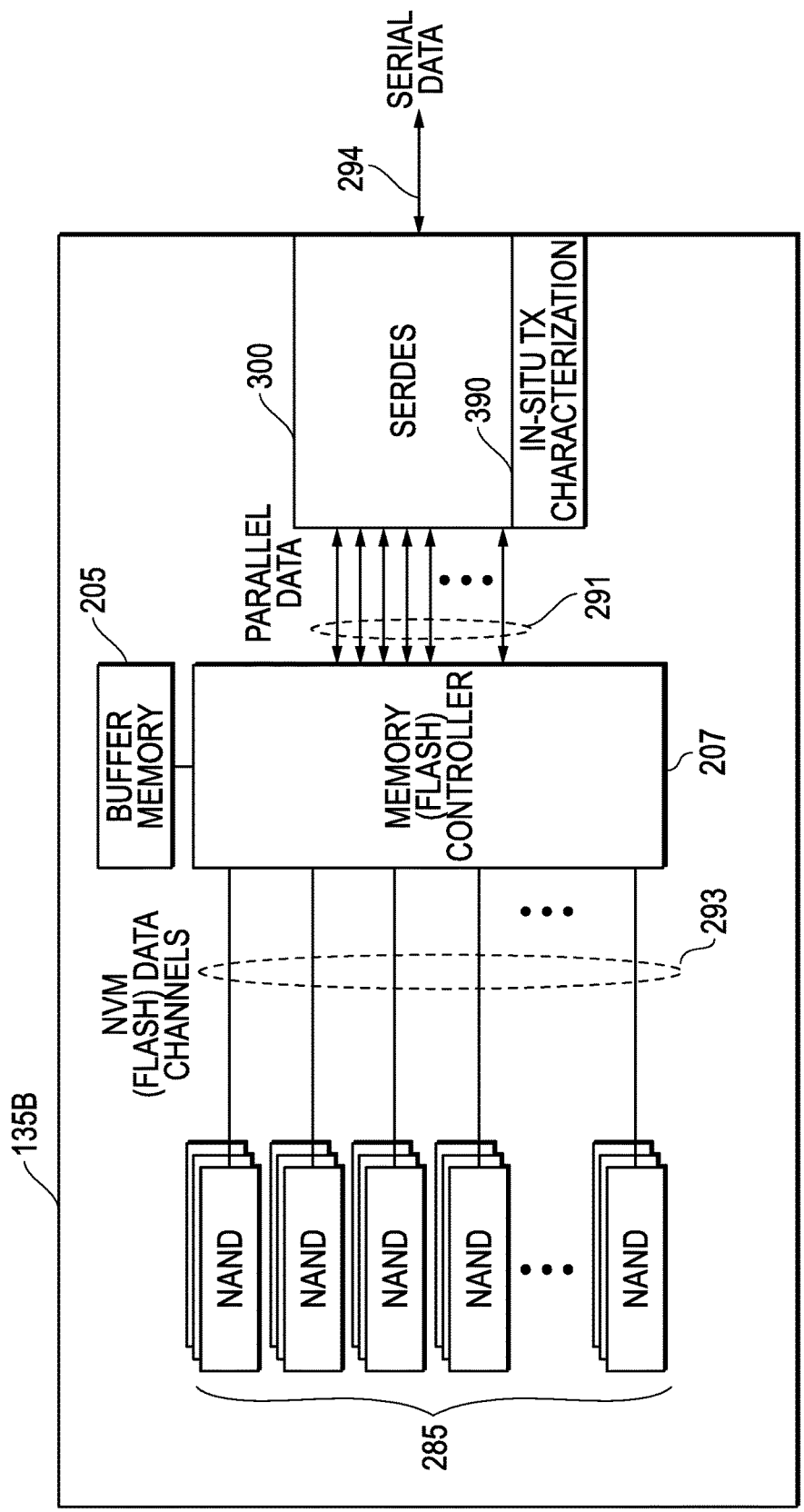
FIG. 2B illustrates a storage device according to one exemplary embodiment of the disclosed systems and methods.

FIG. 2B illustrates one exemplary embodiment of a storage device 135 configured in the form of a solid state drive (SSD) 135B that includes one or more processing devices configured to operate as a memory (Flash) controller 207 that controls reading and writing of data to and from non-volatile memory (e.g., NAND Flash memory) modules 285 across NVM (e.g., Flash) channels 293. Also shown provided is optional buffer 205 (e.g., static random-access memory SRAM) coupled to memory controller 207. As shown, integrated SerDes PHY transceiver circuit 300 (e.g., provided as an integrated circuit chip) is present and includes in-situ transmitter (TX) characterization circuitry 390.

In the illustrated embodiment of FIG. 2B, integrated SerDes PHY transceiver circuit 300 is configured, among other things, to receive incoming serial data from another external component (e.g., such as PCH 110) across serial data communication path 294 and to provide this data as incoming parallel data across parallel data communication path 291 (e.g., ATA data path) to memory controller 207 (e.g., for writing to NVM modules 285). SerDes PHY transceiver circuit 300 is also configured to receive outgoing parallel data (e.g., read from NVM modules 285) from host memory controller 207 across parallel data communication path 291, and to provide this data as outgoing serial data to another external component (e.g., such as PCH 110) across serial data communication path 294.

It will be understood that FIGS. 1, 2A and 2B are exemplary only, and that integrated SerDes circuits having integrated in-situ transmitter (TX) characterization circuitry may be employed in any other system architecture and/or data transmission environment in which a serial/parallel data transmission interface is employed, e.g., such as PCI Express (PCIe), Gigabit Ethernet (GbE), Serial Attached SCSI (SAS), etc. It will also be understood that although particular exemplary embodiments are illustrated herein that integrated SerDes PHY transceiver circuit 300 may be implemented using any suitable type of SerDes architecture, e.g., embedded clock SerDes, parallel clock SerDes, 8 bit/10 bit (8b/10b) SerDes, bit interleaved SerDes, etc. Further, integrated SerDes PHY transceiver circuit may be coupled to any other type of processing device configured to receive and transmit parallel data besides the exemplary controller 206 and 207 of FIGS. 2A and 2B, including such processing devices provided in components such as network controllers, video controllers for imaging or display, etc.

Figure 3:
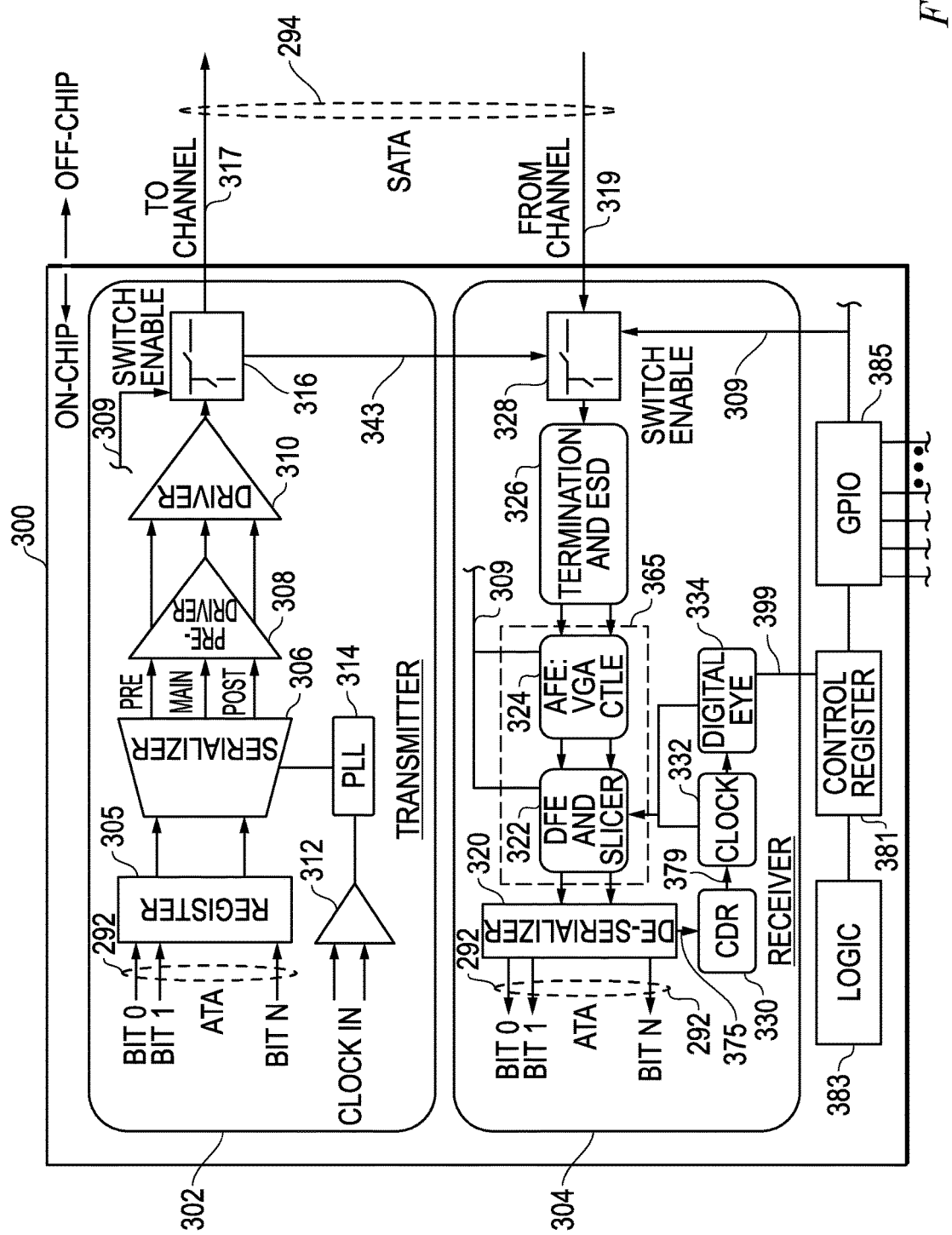
FIG. 3 illustrates an integrated SerDes PHY transceiver circuit according to one exemplary embodiment of the disclosed systems and methods.

FIG. 3 illustrates one exemplary embodiment of integrated SerDes PHY transceiver circuit 300 such as used in a storage device 135 of information handling system 100, although it will be understood that integrated SerDes PHY transceiver circuit 300 may be employed in other system architectures and/or data transmission environments as previously described. As shown, integrated SerDes PHY transceiver circuit 300 includes separate transmitter circuitry 302 and separate receiver circuitry 304 that may be integrated together on the same semiconductor integrated circuit chip, and that operate independently of each other to transmit and receive data, respectively, e.g., across external serial data communication path 294 of information handling system 100. In one embodiment, SerDes PHY circuitry may include at least one integrated processing device (e.g., controller, processor, microcontroller, microprocessor, FPGA, ASIC, CPLD, etc.) that is configured to execute logic 383, and that is coupled to volatile and/or non-volatile memory (e.g., implementing integrated memory software control register) and to GPIOs 385 for off-chip communication of information, data and commands.

In the embodiment of FIG. 3, SerDes transmitter circuitry 302 includes parallel input, serial output (PISO) circuitry that serializes parallel data received from parallel data communication path 292 (e.g., retrieved from NVM or disk storage media of the storage device 135), and driver circuitry that transmits this as outgoing serial data off chip to other separate components of information handling system 100 across an external transmit channel 317 of serial data communication path 294 as previously described. Separate SerDes receiver circuitry 304 includes serial input, parallel output (SIPO) circuitry that receives incoming serial data from the other separate components of information handling system 100 across an external receive channel 319 of serial data communication path 294 as previously described, and de-serializes the received serial data to produce corresponding incoming parallel data that is transmitted across parallel data communication path 292 (e.g., to NVM or disk storage media of the storage device 135). In operation of SerDes PHY 300, transmission of serial data by transmitter circuitry 302 may occur simultaneously with reception of serial data by receiver circuitry 304.

In one embodiment, SerDes transmitter circuitry 302 of SerDes PHY transceiver circuit 300 may transmit outgoing serial data via serial data communication path 294 to a corresponding SerDes receiver circuitry of a separate and different SerDes PHY circuitry 301 of PCH 110, and SerDes receiver circuitry 304 of SerDes PHY transceiver circuit 300 may receive incoming serial data transmitted across serial data communication path 294 from corresponding SerDes transmitter circuitry of the separate and different SerDes PHY circuitry 301 of PCH 110. In one exemplary embodiment of such a configuration, the separate SerDes PHY circuitry 301 of PCH 110 may also be configured with in-situ transmitter (TX) characterization circuitry 390 in the same manner as described herein for SerDes PHY transceiver circuit 300.

As further shown in FIG. 3, integrated on-chip transmitter circuitry 302 of FIG. 3 includes register 305 that is coupled to receive outgoing parallel data 292 and provide it to serializer 306 of a serial data transmit path. Serializer 306 is coupled to receive a clock signal from internal clock generator 312 and phase-locked loop (PLL) 314 which it uses to multiply the incoming parallel clock 312 up to the serial frequency. As shown, serializer 306 serializes the outgoing parallel data (e.g., using a shift register to receive the parallel data once per parallel clock, and shift it out at a higher serial clock rate) and produces outgoing serial data (e.g., pre/main/post signal) to pre-driver 308 and driver 310 of the serial data transmit path as shown. The switch input of an integrated controllable multi-output data switch 316 is coupled to the serial data transmit path within transmitter circuitry 302 so as to receive the outgoing serial data output of driver 310 and to selectively output this outgoing serial data at a given time (one at a time) to either one of a first switch output coupled to external transmit channel 317 of serial data communication path 294 or to a second switch output coupled to an integrated on-chip loopback data communication path 343 that is provided to extend between transmitter circuitry 302 and receiver circuitry 304. In an alternate embodiment, switch 315 may be further optionally configured to selectively output the outgoing serial data at the same time to both the first switch output coupled to external transmit channel 317 of serial data communication path 294 and to the second switch output coupled to integrated on-chip loopback data communication path 343.

Integrated multi-output data switch 316 may be implemented by any suitable controllable multi-way switch circuit such as multiplexer, CMOS switches etc. Control for selecting between first and second switch outputs of switch 316 (and optionally for selecting both first and second switch outputs of switch 316) may be provided in one embodiment, for example, by a selection control signal such as a switch enable signal provided by control signal path 309 to switch 316 via one or more GPIOs 385 from an external user (such as human tester, designer, etc.) to transceiver circuit 300 on laboratory test bench via connected test equipment such as computer workstation, via input devices 112 of system 100, etc.

Still referring to FIG. 3, integrated on-chip receiver circuitry 304 of FIG. 3 includes a controllable integrated multi-input data switch 328 that is configured to selectively receive at a given time (one at a time) either one of incoming serial data at a first switch input that is coupled to external receive channel 319 of serial data communication path 294, or looped-back serial data from the serial data transmit path of transmitter circuitry 302 at a second input that is coupled to integrated on-chip loopback data communication path 343. Integrated multi-input data switch 328 may be implemented by any suitable controllable multi-way switch circuit such as multiplexer, CMOS switch, etc. Control for selecting between first and second switch inputs of switch 328 may be provided in one embodiment, for example, by the same switch enable command signal across control signal path 309 provided to switch 328 in a similar manner as described above, although a separate control signal may alternatively be employed for this purpose. As described herein, multi-output data switch 316, integrated on-chip loopback data communication path 343, and integrated multi-input data switch 328 are included as components of in-situ transmitter (TX) characterization circuitry 390 of FIGS. 1, 2A and 2B.

The switch output of integrated multi-input data switch 328 is coupled to provide the selected serial data to a serial data receive path that includes impedance-matching termination resistor circuitry and electrostatic discharge (ESD) circuitry 326, and then passed on as shown to receiver front-end circuitry components 324 for signal conditioning. In this embodiment, signal front end conditioning components 324 of the serial data receive path include receiver analog front end (AFE) for amplification and filtering, variable gain amplifier (VGA), and continuous time linear equalizer (CTLE). Serial data from circuitry components 324 is then provided to digital feedback equalizer (DFE) of the serial data receive path for additional conditioning to remove jitter and to data slicer circuitry 322 before being provided to deserializer circuit 320 of the serial data receive path where incoming serial data from communication path 294 is converted to output data latches and incoming parallel data provided to parallel data communication path 292 as shown. In one exemplary embodiment, deserializer circuit 320 may include two registers connected as a double buffer, with one register being used to clock in the input serial data stream, and with the other register used to hold the incoming data for the (slower) parallel output side, although any other suitable configuration may be employed. In this regard, deserializer circuit 320 may be configured to divide the incoming clock down to the parallel rate.

As further shown in FIG. 3, in this exemplary embodiment integrated on-chip receiver circuitry 304 includes clock and data recovery (CDR) circuitry 330 coupled to receive a sliced version 375 of incoming serial data that is provided from de-serializer 320 of the serial data receive path. CDR circuitry 330 is in turn configured to extract an embedded clock signal from the sliced incoming serial data so as to recover and produce a receive clock 332 from the incoming serial data. As shown receive clock 332 is then provided to DFE and data slicer circuitry 322 and to on-chip integrated digital eye monitor circuitry 334. CDR circuitry also may be configured to recover incoming serial data 379 by sampling and timing pulses of the sliced incoming serial signal. Any suitable type CDR circuitry may be employed, e.g., such as PLL, gated or synchronous oscillator, etc.

As will be further described herein, signal conditioning components 365 (e.g., AFE, VGA, CTLE, and DFE components) of receiver circuitry 304 may be disabled in response to switch enable command provided across control signal path 309 that may also be coupled to control these signal conditioning components in addition to switches 316 and 328 (or any other suitable control signal and/or control signal path 309) at the same time that data switch 328 is controlled to receive only looped-back serial data from transmitter circuitry 302 via loopback data communication path 343. In one embodiment, switching off these signal conditioning components of receiver side circuit 304 allows the unconditioned looped back transmitted serial data signal 379 from transmitter side circuit 302 to be provided at the latch with clock 332 to digital eye 334 such that the transmit side digital eye may be accurately captured in its pristine and unconditioned form and without interference from external circuitry and other external factors.

Digital eye monitor circuitry 334 is configured to observe receive-side incoming serial data received from off-chip path 294 by the SerDes receiver side circuitry 304, or looped back transmitter-side serial data received from loopback communication path 343 in a manner as described further herein. In either case, digital eye monitor circuitry 334 determines or captures the on-chip digital signal eye of serial data signal provided to digital eye 334 at the signal latch from de-serializer 320 through CDR 330 and clock 332. In this regard, the digital signal eye of the receive signal may be determined in any suitable manner, e.g., such as by shifting the phase rotator sensors left and right until failure occurs and/or by shifting the voltage offset up and down until failure occurs; by using analog to digital conversion (ADC) oscilloscope techniques, etc.

Still referring to FIG. 3, digital eye monitor circuitry 334 may output the determined on-chip digital eye information 399, e.g., via software control register/s 381 and GPIOs 385 for display on an external display device of a connected portable computer system or workstation so that performance of SerDes PHY transceiver circuit 300 may be evaluated externally by human user/s, saved in an external data file for later analysis, analyzed by external processing, etc. In one embodiment, the digital eye information 399 from digital eye monitor circuitry 334 may be so output and analyzed during laboratory bench testing or other type of SerDes device characterization of an individual integrated SerDes PHY transceiver circuit 300 (e.g., provided as an integrated circuit chip device). In an alternative embodiment, SerDes PHY transceiver circuit 300 may be tested while installed in a storage device 135. In a further embodiment, SerDes PHY transceiver circuit 300 may be tested while installed in system 100, in which case digital eye information 399 may be output for display or analysis via PCH 110, graphics 120 and display device 125 of system 100 when SerDes PHY transceiver circuit 300 tested.

In one exemplary embodiment illustrated in FIGS. 5-8, digital eye monitor circuitry 334 may be configured to monitor and determine an on-chip in-situ digital eye by sweeping x-axis (time) and y-axis (voltage amplitude), and determining a corresponding Bit Error Rate (BER) by comparing a roaming sample with the data sample. In this regard, BER may be measured for each x and y offset, and a digital eye based on measured BER may be created and plotted after sweeping x offset and y offset pairs. Examples of digital eye creation and displays may be found described in U.S. Pat. Nos. 8,553,469; 8,949,679; and United States Patent Application Publication Number 2014/0173367, each of the foregoing being incorporated herein by reference in its entirety for all purposes.

Although an exemplary embodiment of a SerDes PHY transceiver circuit 300 employed with a storage device 135 for an information handling system 100 has been illustrated herein, it will be understood that the disclosed systems and methods may be implemented for in-situ on-chip digital eye capture of serial data transmitter-side signal of a SerDes PHY employed in any other serial-to-parallel data architecture environment, such as PCIe, SAS, GbE etc. It will also be understood that the disclosed systems and methods may be employed for SerDes PHY circuitry connected to a variety of different types of serial data communication links including, but not limited to, SATA, Infiniband, Fibre Channel, Gigabit Ethernet, XAUI, RXAUI, SAS, SATA, USB 3.0, PCI Express, etc.

Returning to FIG. 3, logic 383 may be provided to control components of SerDes PHY transceiver circuit 300 to selectively implement a normal data communication operation mode or a transmitter side digital eye test mode in response to commands received from off-chip, such as via GPIOs 385. During normal data communication operation mode of SerDes PHY transceiver circuit 300, multi-output data switch 316 is set to output outgoing serial data to channel 317 of communication path 294 and not to loopback data communication path 343. Similarly, multi-input data switch 328 is set in normal data communication operation mode to receive incoming serial data from channel 319 of serial data communication path 294 and not to receive data from loopback data communication path 343. Also in normal data communication operation mode, signal conditioning components of receiver side circuitry 304 are enabled (e.g., AFE, VGA, CTLE, and DFE components) to allow incoming serial data from serial data communication path 294 to be conditioned (e.g., amplified, filtered, equalized, etc.) and then de-serialized and output as parallel data to parallel data communication path 292. During this normal data communication operation mode, digital eye monitor circuitry 334 is enabled to capture a receiver-side digital eye of incoming serial data at the latch after conditioning by components of the receive side circuitry 304, and to output the captured receiver side digital eye for display on an external display device so that performance of receive side circuitry 304 may be evaluated.

Still referring to FIG. 3, a transmitter side digital eye test mode may be selectively initiated, e.g., response to a control signal such as switch enable command 309 provided to SerDes PHY transceiver circuit 300 from an external user as previously described. In the transmitter side digital eye test mode, multi-output data switch 316 of transmitter side circuitry 302 is controlled to output outgoing serial data to on-chip loopback data communication path 343 rather than to serial data communication path 294, and multi-input data switch 328 of receiver side circuitry 304 is controlled to receive serial data from on-chip loopback data communication path 343 rather than serial data communication path 294. At the same time, signal conditioning components (e.g., AFE, VGA, CTLE, and DFE components) of receiver circuitry 304 are disabled. Thus, in this transmitter side digital eye test mode configuration, outgoing serial data from transmitter side circuitry 302 is transferred to the input of receiver side circuitry 304 and provided to digital eye monitor circuitry 334 of receiver circuitry 304 at the latch through de-serializer 320 and CDR/clock 330 and 332. Digital eye monitor circuitry 334 in turn captures the transmitter-side digital eye of incoming serial data at the latch after equalization by components of the receive side circuitry 304, and is configured to provide the captured transmitter side digital eye output for display on an external display device so that performance of transmitter side circuitry 302 may be evaluated. Switching off the above-noted signal conditioning components of receiver side circuit 304 allows the unconditioned looped back transmitted serial data signal from transmitter side circuit 302 to be provided at the latch to digital eye 334 such that the transmit side digital eye may be accurately captured in its pristine and unconditioned form.

After testing, transmitter side digital eye test mode of SerDes PHY transceiver circuit 300 may be terminated by an external user using a control signal such as switch enable command signal 309 to cause transceiver circuit 300 to enter normal data communication operation mode of SerDes PHY transceiver circuit 300 in which multi-output data switch 316 is set to output outgoing serial data to channel 317 of communication path 294 and not to loopback data communication path 343, multi-input data switch 328 is set to receive incoming serial data from channel 319 of serial data communication path 294 and not to receive data from loopback data communication path 343, and signal conditioning components of receiver side circuitry 304 are enabled to allow incoming serial data from serial data communication path 294 to be conditioned, de-serialized, and output as parallel data to parallel data communication path 292.

Figure 4:
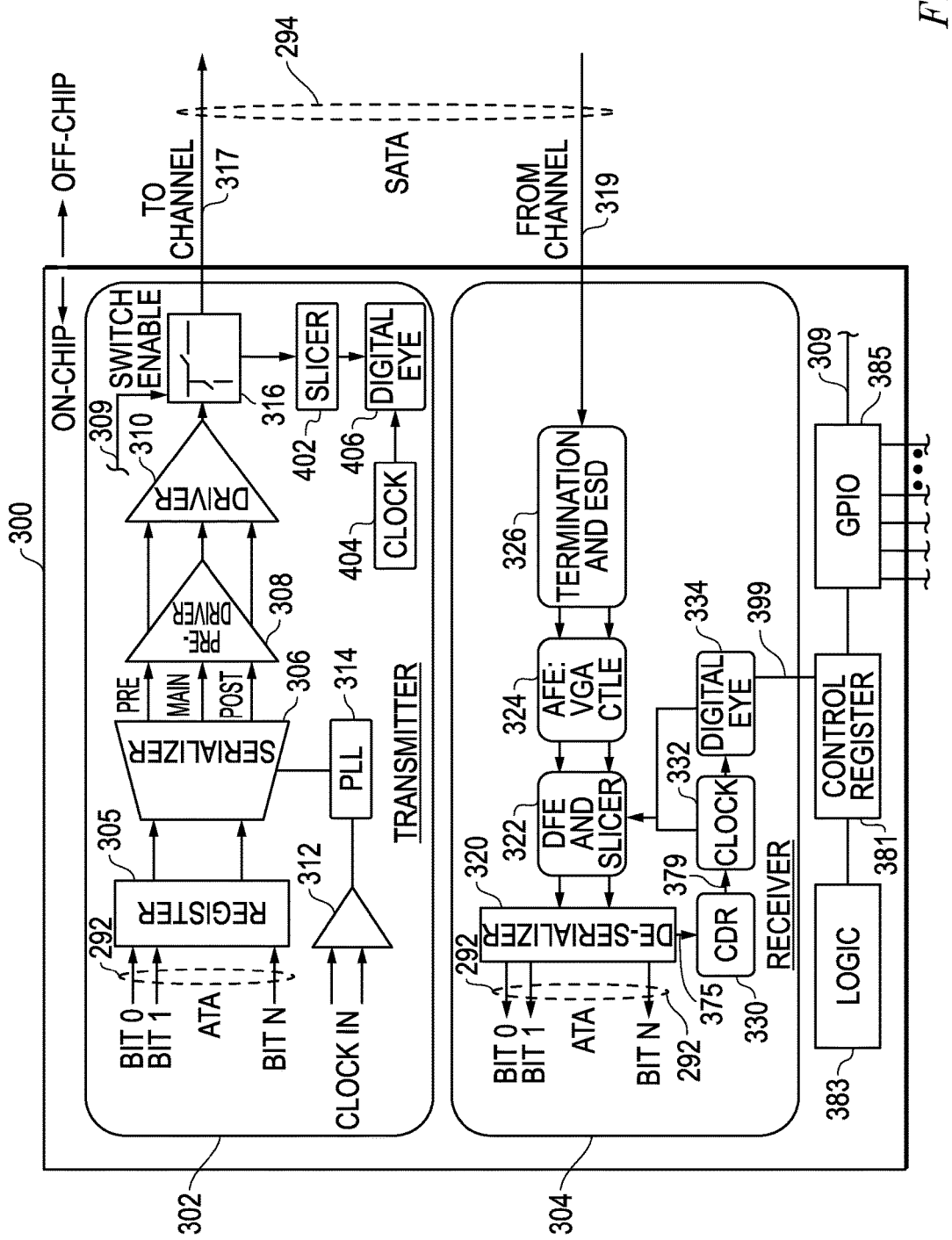
FIG. 4 illustrates an integrated SerDes PHY transceiver circuit according to one exemplary embodiment of the disclosed systems and methods.
Figure 5:
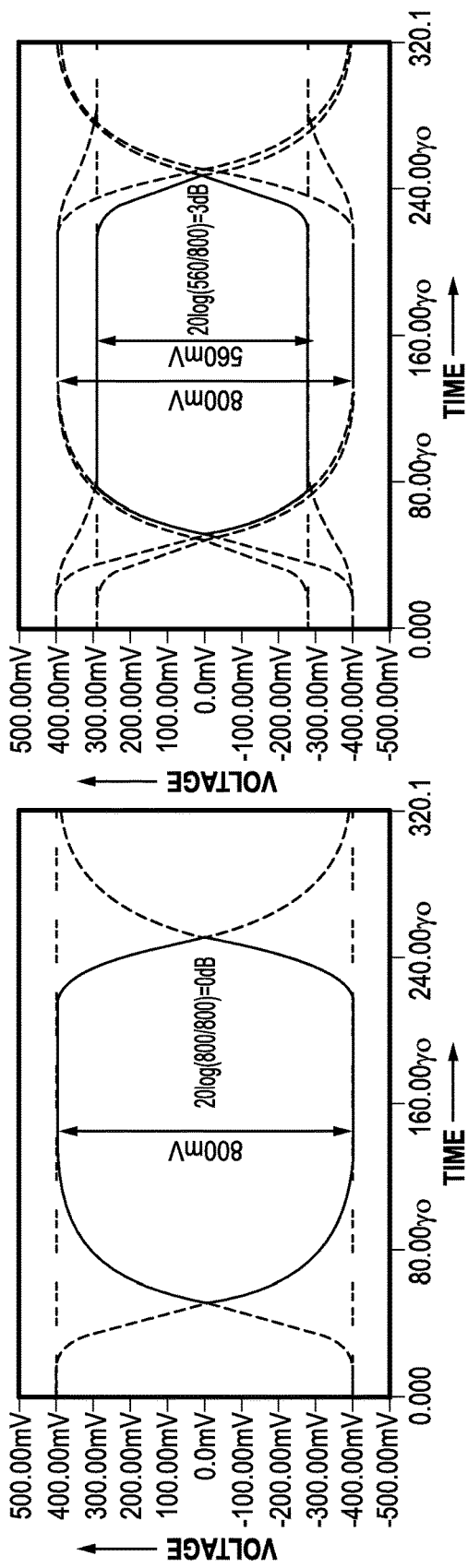
FIG. 5 illustrates transmitter side signal digital eyes according to one exemplary embodiment of the disclosed systems and methods.
Figure 6:
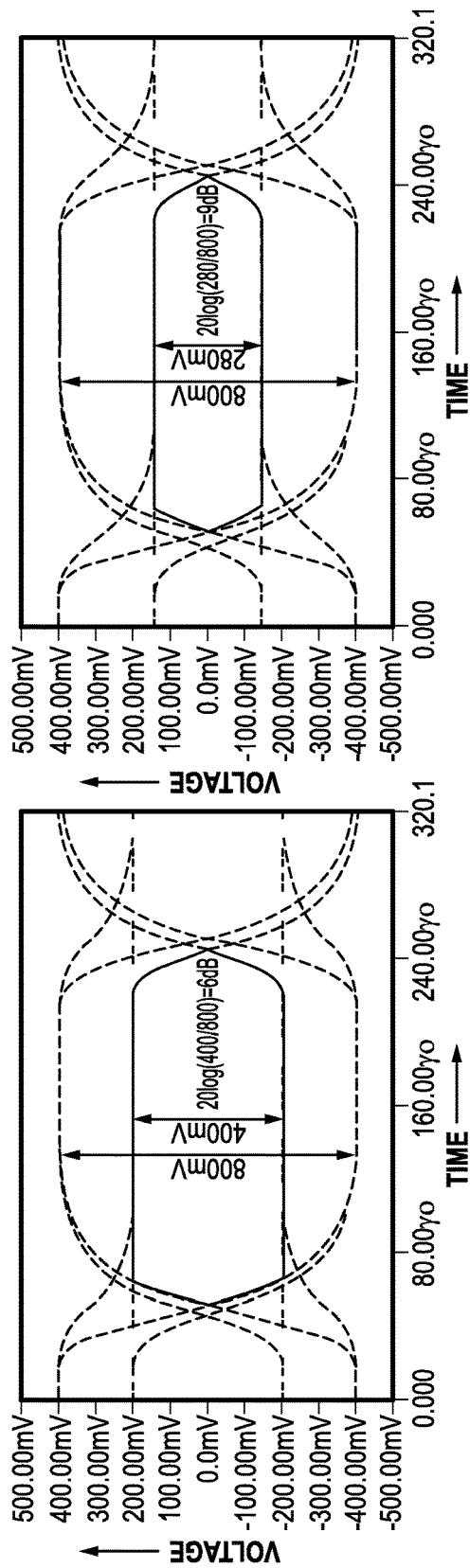
FIG. 6 illustrates transmitter side signal digital eyes according to one exemplary embodiment of the disclosed systems and methods.

FIG. 4 illustrates an alternative embodiment that may be implemented to in-situ capture a digital signal eye of a serial transmit signal produced by a transmitter circuit 302 of integrated SerDes PHY transceiver circuit 300. In this exemplary embodiment, a switch input of an integrated controllable multi-output data switch 316 within transmitter circuitry 302 is coupled to receive the outgoing serial data output of driver 310 and to selectively output this outgoing serial data to either one of a first switch output coupled to external transmit channel 317 of serial data communication path 294 or to a second switch output coupled to data slicer 402 and integrated transmitter side digital eye monitor circuitry 406. As shown, transmitter side digital eye monitor circuitry 406 is configured in this embodiment to receive a clock signal from clock 404 (e.g., which may be provided by clock generator 312 or other suitable clock source) and to observe transmit-side outgoing serial data received from driver 310 of transmitter side circuitry 302. In this regard, digital eye monitor circuitry 406 may be configured to operate to observe, capture and output the transmit-side digital eye in the same manner as described herein for receiver side digital eye monitor circuitry 334. Additionally, a transmitter side digital eye test mode may be selectively initiated in the embodiment of FIG. 4 in response to a control signal such as switch enable command 309 provided to SerDes PHY transceiver circuit 300 from an external user as previously described in relation to FIG. 3. In this regard, multi-output data switch 316 of transmitter side circuitry 302 is controlled in a transmitter side digital eye test mode to output outgoing serial data to data slicer 402 and to digital eye monitor circuitry 406 rather than to serial data communication path 294. Similar to the embodiment of FIG. 3, multi-output data switch 316 of transmitter side circuitry 302 is controlled in normal data communication mode to output outgoing serial data to serial data communication path 294 rather than to data slicer 402/digital eye monitor circuitry 406.

Figure 7:
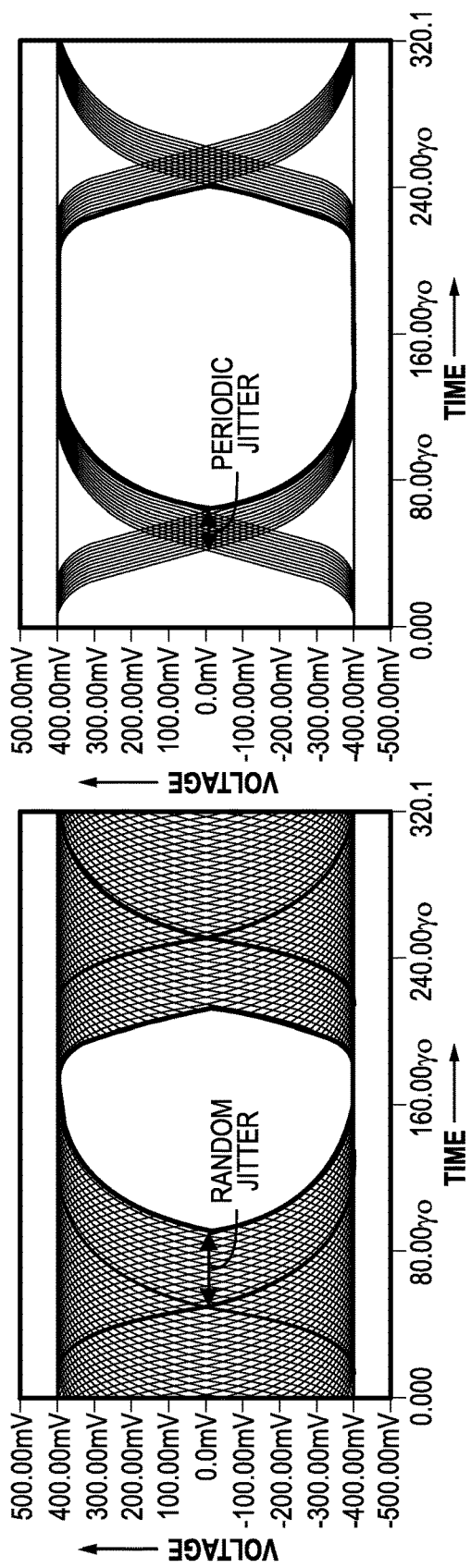
FIG. 7 illustrates transmitter side signal digital eyes according to one exemplary embodiment of the disclosed systems and methods.
Figure 8:
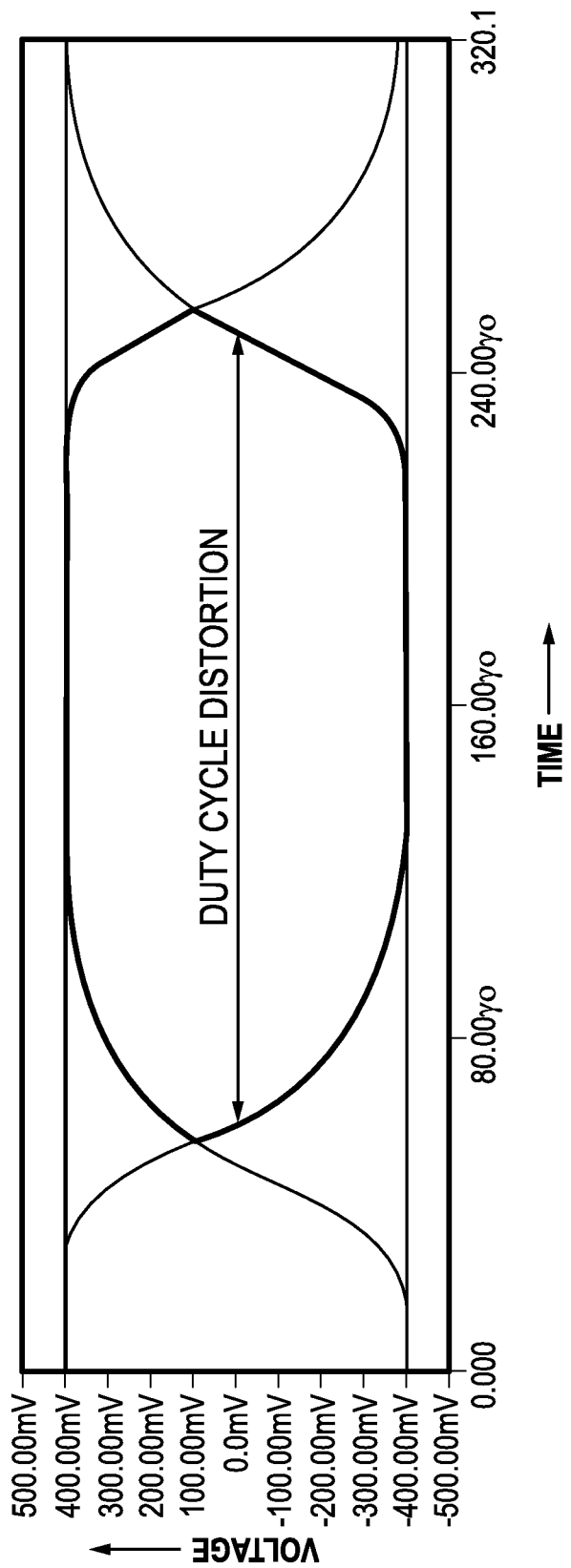
FIG. 8 illustrates a transmitter side signal digital eye according to one exemplary embodiment of the disclosed systems and methods.
Figure 9:
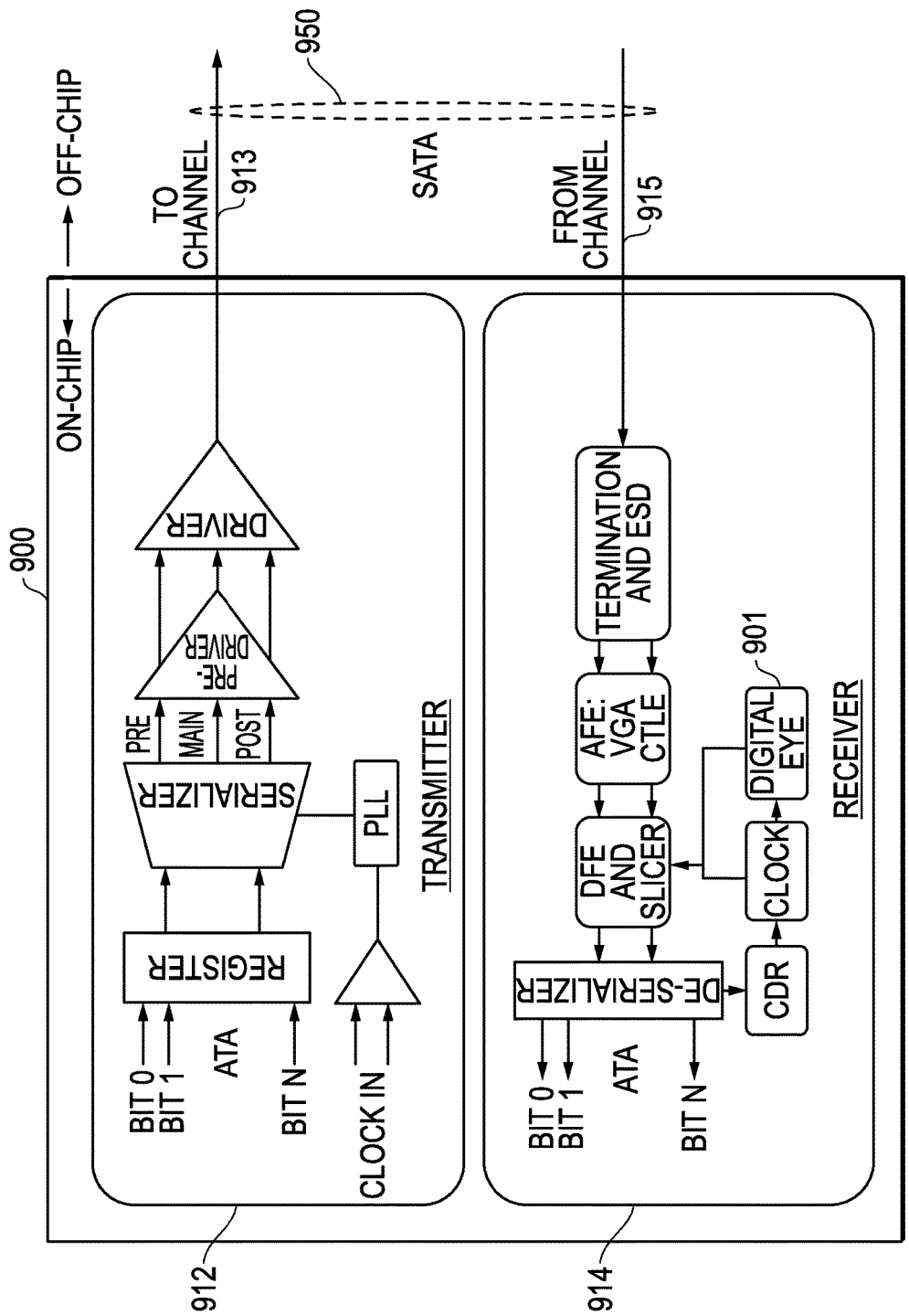
FIG. 9 illustrates a conventional integrated SerDes PHY circuit.

FIGS. 5-8 illustrate digital eye output results of a mock test performed for various de-emphasis levels like 0, 3, 6 and 9 dB using receiver side on-chip digital eye monitor circuitry to capture a serial transmit signal produced by a transmitter circuit of integrated SerDes PHY circuitry via a loopback data communication path during a transmitter side digital eye test mode. As can be seen from FIGS. 5 and 6, transmitter de-emphasis (or equalization) and transmitter voltage swing (V-swing) levels are accurately estimated on chip by receiver side digital eye monitor circuitry. FIGS. 7 and 8 illustrates jitter estimation and de-composition estimated on chip by receiver side digital eye monitor circuitry, with FIG. 8 illustrating duty cycle distortion. The level of in-situ digital eye accuracy for transmitter side circuitry that is obtained using the disclosed systems and methods and illustrated in FIGS. 5-8 is not possible with external test board-based characterization of SerDes PHY circuitry.

It will be understood that the presence of transmitter side multi-output data switch 316 and/or receiver side multi-input data switch 328 is optional, and that transmitter outgoing serial data may be provided via any other suitable alternative integrated data path configuration to an integrated digital eye monitor 334 that is provided within an integrated SerDes PHY transceiver circuit 300. It will also be understood that one or more of the tasks, functions, or methodologies described herein (e.g., including methodology 200 of FIG. 2 and tasks or functions of described herein for components 105, 120, 128, 178, 180, 300, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device such as CPU, controller, microcontroller, processor, microprocessor, FPGA, ASIC, or other suitable processing device) to perform one or more steps of the methodologies disclosed herein. In one embodiment, such a processing device may be selected from the group consisting of CPU, controller, microcontroller, processor, microprocessor, FPGA and ASIC. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Serializer/deserializer physical layer (SerDes PHY) integrated transceiver circuitry of a single integrated circuit chip, the SerDes PHY integrated transceiver circuitry being configured to be coupled between an off-chip external serial data communication path and an external parallel data communication path, the SerDes PHY integrated transceiver circuitry comprising:
   a receiver completely integrated within the single integrated circuit chip and configured to receive incoming serial data from the off-chip external serial data communication path and to provide incoming parallel data to the external parallel data communication path, the receiver comprising a serial data receive path that comprises a de-serializer coupled to produce the incoming parallel data from the receiver incoming serial data; and
   a transmitter completely integrated within the single integrated circuit chip and coupled by an on-chip internal data communication path to an integrated digital eye monitor, the transmitter being configured to be coupled to receive outgoing parallel data from the external parallel data communication path and to provide transmitter outgoing serial data to the off-chip external serial data communication path via an external transmit channel, the transmitter comprising a serial data transmit path that includes a serializer configured to produce the transmitter outgoing serial data;
   where the integrated digital eye monitor is completely integrated on-chip within the single integrated circuit chip and is coupled to the serial data transmit path to selectively receive the transmitter outgoing serial data from the serial data transmit path with the external serial data communication path disconnected from the serial data transmit path such that no outgoing serial data is provided to the external serial data communication path when the outgoing serial data is received by the integrated digital eye monitor from the serial data transmit path;
   where the transmitter is configured to selectively provide the transmitter outgoing serial data from the transmitter as follows:
      first to provide the transmitter outgoing serial data to only the off-chip external serial data communication path via the external transmit channel, and
      then to provide the transmitter outgoing serial data to only the on-chip integrated digital eye monitor of the SerDes PHY integrated transceiver circuitry via the on-chip internal data communication path;
   where the integrated digital eye monitor is configured to capture and observe the outgoing serial data received from the transmitter via the on-chip internal data communication path to measure digital signal eye information of the outgoing serial data, and to output the measured digital signal eye information externally from the single integrated circuit chip, the digital signal eye information including at least one of transmitter equalization, transmitter amplitude, transmitter jitter, duty cycle distortion, transmitter outer eye voltage swing and transmitter inner eye voltage swing, or rise time produced from the outgoing serial data provided from the serial data transmit path of the transmitter via the on-chip internal data communication path;
   where the SerDes PHY integrated transceiver circuitry further comprises an integrated loopback data communication path coupled between the transmitter and the receiver, where the receiver comprises the integrated digital eye monitor, where the integrated digital eye monitor of the receiver is coupled to receive the transmitter outgoing serial data from the serial data transmit path only through the integrated loopback data communication path, and where the integrated digital eye monitor of the receiver is configured to capture and output digital signal eye information based on the transmitter outgoing serial data; and
   where the serial data receive path includes one or more signal conditioning components that comprise an amplifier coupled between an input of the serial data receive path and the de-serializer, and where the transmitter is configured to disable the signal conditioning components in response to a control signal received from an external user to turn off the signal conditioning components at the same time that the receiver is receiving the transmitter outgoing serial data to provide an unconditioned looped back transmitted serial data signal to the integrated digital eye monitor at the same time that the integrated digital eye monitor of the receiver is capturing the digital signal eye information.

2. A method, comprising:

receiving the outgoing parallel data from the external parallel data communication path in the transmitter of the serializer/deserializer physical layer (SerDes PHY) integrated transceiver circuitry of claim 1;

producing the outgoing serial data from the outgoing parallel data in the serial data transmit path of the transmitter; and switching between the external transmit channel and the on-chip internal data communication path to selectively provide the outgoing serial data from the serial data transmit path of the transmitter as follows:

first to provide the transmitter outgoing serial data to only the off-chip external serial data communication path via the external transmit channel, and then to provide the transmitter outgoing serial data to only the on-chip integrated digital eye monitor of the SerDes PHY integrated transceiver circuitry from the serial data transmit path of the transmitter via the on-chip internal data communication path, and using the on-chip integrated digital eye monitor of the SerDes PHY integrated transceiver circuitry to capture and observe the outgoing serial data received from the transmitter via the on-chip internal data communication path to measure the digital signal eye information of the outgoing serial data, and to output the measured digital signal eye information externally from the single integrated circuit chip, the digital signal eye information including the at least one of transmitter equalization, transmitter amplitude, transmitter jitter, duty cycle distortion, transmitter outer eye voltage swing and transmitter inner eye voltage swing, or rise time produced from the outgoing serial data provided from the serial data transmit path of the transmitter via the on-chip internal data communication path; and where the method further comprises:

receiving the transmitter outgoing serial data in the digital eye monitor of the receiver from the serial data transmit path only through the integrated loopback data communication path, and using the transmitter to disable the signal conditioning components of the serial data receive path in response to a control signal received from an external user to turn off the signal conditioning components at the same time that the receiver is receiving the transmitter outgoing serial data to provide an unconditioned looped back transmitted serial data signal to the integrated digital eye monitor at the same time that the integrated digital eye monitor of the receiver is capturing the digital signal eye information.

3. The method of claim 2, further comprising:

receiving incoming serial data from the external serial data communication path in a receiver of the SerDes PHY integrated transceiver circuitry;

producing incoming parallel data from the incoming serial data in the serial data receive path of the receiver; and providing the incoming parallel data from the receiver to the external parallel data communication path.

4. The method of claim 2, further comprising responding to a control signal from an external user by selectively outputting the outgoing serial data one at a time to either one of only the external serial data communication path or only the integrated digital eye monitor.

5. The method of claim 3, further comprising selectively providing at a given time one of only the transmitter outgoing serial data from the integrated loopback data communication path or only the receiver incoming serial data from the incoming serial data path to the digital eye monitor through the serial data receive path of the receiver.

6. The method of claim 5, further comprising responding to a control signal from an external user by selectively outputting the transmitter outgoing serial data only through the integrated loopback data communication path and by selectively providing only the transmitter outgoing serial data from the integrated loopback data communication path to the integrated digital eye monitor through the serial data receive path of the receiver.

7. The integrated transceiver circuitry of claim 1, where the transmitter is coupled to selectively output the transmitter outgoing serial data one at a time to either one of only the external serial data communication path, or only to the integrated digital eye monitor.

8. The integrated transceiver circuitry of claim 1, further comprising:

a transmitter side multi-output data switch having a switch input coupled to receive the transmitter outgoing serial data from the serial data transmit path and configured to selectively output the transmitter outgoing serial data one at time to either one of only a first switch output that is configured for coupling to the external serial data communication path, or only a second switch output that is coupled to the integrated digital eye monitor;

where the transmitter is configured to be coupled to receive a switch enable signal from an external user; and where the transmitter side multi-output data switch is configured to select to provide the transmitter outgoing serial data to only the second switch output and not to the first switch output in response to the switch enable signal.

9. The integrated transceiver circuitry of claim 1, further comprising:

a transmitter side multi-output data switch having a switch input coupled to receive the transmitter outgoing serial data from the serial data transmit path and configured to selectively output the transmitter outgoing serial data one at time to either one of only a first switch output that is configured for coupling to the external serial data communication path, or only a second switch output that is coupled to the integrated digital eye monitor;

where the integrated digital eye monitor is integrated within the receiver;

where the integrated digital eye monitor of the receiver is coupled to the second switch output of the transmitter side multi-output data switch by the integrated loopback data communication path;

where the transmitter side multi-output data switch is configured to selectively output the transmitter outgoing serial data from the second switch output to only the integrated digital eye monitor through the integrated loopback data communication path.

10. The integrated transceiver circuitry of claim 9, where the digital eye monitor is coupled to the serial data receive path; where the receiver further comprises a receiver side multi-input data switch having a switch output coupled to the serial data receive path, a first switch input coupled to the integrated loopback data communication path, and a second switch input configured for coupling to the external serial data communication path; and where the receiver side multi-input data switch is configured to selectively provide only the transmitter outgoing serial data from the integrated loopback data communication path to the digital eye monitor through the serial data receive path of the receiver or only the receiver incoming serial data from the incoming serial data path to the digital eye monitor through the serial data receive path of the receiver.

11. The integrated transceiver circuitry of claim 10, where each of the transmitter and receiver is configured to be coupled to receive a switch enable signal from an external user; where the transmitter side multi-output data switch is configured to select to provide the transmitter outgoing serial data only to the second switch output in response to the switch enable signal provided by an external user at the same time that the receiver side multi-input data switch is configured to select to provide only the transmitter outgoing serial data from the integrated loopback data communication path to the digital eye monitor through the serial data receive path of the receiver in response to the switch enable signal.

12. The method of claim 2, further comprising using the on-chip integrated digital eye monitor of the SerDes PHY integrated transceiver circuitry to capture and measure the digital signal eye information of the outgoing serial data received from the transmitter by:
sweeping x-axis (time) and y-axis (voltage amplitude) of the outgoing serial data received from the transmitter;
then measuring a corresponding Bit Error Rate (BER); and
then using the measured BER to create and plot a captured digital signal eye of the outgoing serial data received from the transmitter.

13. The method of claim 2, where the digital signal eye information includes each of transmitter equalization, transmitter amplitude, and transmitter jitter from the outgoing serial data provided from the serial data transmit path of the transmitter.

14. The method of claim 2, where the method further comprises selectively outputting the transmitter outgoing serial data from the serial data transmit path of the transmitter to the integrated digital eye monitor through a data slicer integrated in the transmitter of the SerDes PHY integrated transceiver circuitry; and using the integrated digital eye monitor of the receiver to capture and output digital signal eye information externally from the integrated circuit chip based on the transmitter outgoing serial data.

15. The method of claim 12, further comprising outputting the plotted captured digital signal eye information to at least one display device for display to a human user.

16. The method of claim 12, further comprising measuring the digital signal eye information from the plotted captured digital signal eye, the digital signal eye information comprising each of transmitter equalization, transmitter jitter, duty cycle distortion, transmitter outer eye voltage swing and transmitter inner eye voltage swing, and rise time.

17. The method of claim 12, further comprising measuring the digital signal eye information from the plotted captured digital signal eye, the digital signal eye information comprising each of outer eye voltage swing and inner eye voltage swing.

18. An information handling system, comprising:
at least one host processing device coupled to at least one of local system storage or a platform controller hub (PCH);
a serial data communication path coupled to a first serializer/deserializer physical layer (SerDes PHY) integrated transceiver circuitry;
a parallel data communication path coupled to a processing device configured to receive and transmit parallel data; and
integrated circuitry of a single integrated circuit chip and installed within one of the local system storage or the PCH that is configured as a second SerDes PHY integrated transceiver circuitry that is coupled between the serial data communication path and the parallel data communication path, each of the serial data communication path and the parallel data communication path being off-chip and external to the integrated SerDes PHY integrated transceiver circuitry of the local system storage or PCH;
where the second SerDes PHY integrated transceiver circuitry comprises:
a receiver completely integrated within the single integrated circuit chip and coupled to receive incoming serial data from the off-chip external serial data communication path and to provide incoming parallel data to the processing device across the external parallel data communication path, the receiver comprising a serial data receive path that comprises a de-serializer coupled to produce the incoming parallel data from the receiver incoming serial data, and
a transmitter completely integrated within the single integrated circuit chip and coupled to receive outgoing parallel data from the processing device across the external parallel data communication path and to provide transmitter outgoing serial data to the first SerDes PHY integrated transceiver circuitry across the off-chip external serial data communication path via an external transmit channel, the transmitter comprising a serial data transmit path that includes a serializer configured to produce the transmitter outgoing serial data, and
an integrated digital eye monitor completely integrated on-chip within the single integrated circuit chip and coupled to the serial data transmit path by an on-chip internal data communication path to selectively receive the transmitter outgoing serial data from the serial data transmit path while the first SerDes PHY integrated transceiver circuitry and the second SerDes PHY integrated transceiver circuitry are installed within the information handling system and while the second SerDes PHY integrated transceiver circuitry is installed within one of the local system storage or the PCH with the external serial data communication path disconnected from the serial data transmit path such that no outgoing serial data is provided to the external serial data communication path when the outgoing serial data is received by the integrated digital eye monitor from the serial data transmit path;
where the transmitter of the second SerDes PHY integrated transceiver circuitry is configured to selectively provide the transmitter outgoing serial data from the transmitter as follows:
first to provide the transmitter outgoing serial data to only the off-chip external serial data communication path via the external transmit channel, and
then to provide the transmitter outgoing serial data to only the on-chip integrated digital eye monitor of the second SerDes PHY integrated transceiver circuitry via the on-chip internal data communication path; and
where the integrated digital eye monitor of the second SerDes PHY integrated transceiver circuitry is configured to capture and observe the outgoing serial data received from the transmitter of the second SerDes PHY integrated transceiver circuitry via the on-chip internal data communication path to measure digital signal eye information of the outgoing serial data, and to output the measured digital signal eye information externally from the single integrated circuit chip, the digital signal eye information including at least one of transmitter equalization, transmitter amplitude, transmitter jitter, duty cycle distortion, transmitter outer eye voltage swing and transmitter inner eye voltage swing, or rise time produced from the outgoing serial data provided from the serial data transmit path of the transmitter via the on-chip internal data communication path.

19. The system of claim 18, where the integrated digital eye monitor is integrated within the transmitter; and where the transmitter is coupled to output the transmitter outgoing serial data one at time to either one of only the external serial data communication path, or only the integrated digital eye monitor.

20. The system of claim 18, where the second SerDes PHY integrated transceiver circuitry further comprises an integrated loopback data communication path coupled between the transmitter and the receiver of the second SerDes PHY integrated transceiver circuitry; where the receiver of the second SerDes PHY integrated transceiver circuitry comprises the integrated digital eye monitor; where the integrated digital eye monitor is coupled to receive only the transmitter outgoing serial data from the serial data transmit path through the integrated loopback data communication path; and where the integrated digital eye monitor of the receiver of the second SerDes PHY integrated transceiver circuitry is configured to capture and output digital signal eye information based on the transmitter outgoing serial data.

21. The system of claim 18, where the information handling system is at least one of a server system, desktop or tower computer system, or notebook computer system; and where the integrated digital eye monitor is coupled to the serial data transmit path to receive the transmitter outgoing serial data from the serial data transmit path while the first SerDes PHY integrated transceiver circuitry and the second SerDes PHY integrated transceiver circuitry are installed and operating within the information handling system.

* * * * *